(12) United States Patent
You

(10) Patent No.: US 9,279,833 B2
(45) Date of Patent: Mar. 8, 2016

(54) ONLINE ALTERNATING CURRENT DETECTION DEVICE AND METHOD

(76) Inventor: Xuanlai You, Xiamen (CN)

(*) Notice: Subject to any disclaimer, the term of this patent is extended or adjusted under 35 U.S.C. 154(b) by 71 days.

(21) Appl. No.: 14/130,522

(22) PCT Filed: Jun. 29, 2012

(86) PCT No.: PCT/CN2012/077812
§ 371 (c)(1),
(2), (4) Date: Jan. 2, 2014

(87) PCT Pub. No.: WO2013/004146
PCT Pub. Date: Jan. 10, 2013

(65) Prior Publication Data
US 2014/0159753 A1    Jun. 12, 2014

(30) Foreign Application Priority Data

Jul. 1, 2011  (CN) .......................... 2011 1 0185078

(51) Int. Cl.
*G01R 19/00*  (2006.01)
*G01R 35/00*  (2006.01)
*G01R 1/20*   (2006.01)

(52) U.S. Cl.
CPC ............ *G01R 19/00* (2013.01); *G01R 19/0092* (2013.01); *G01R 1/203* (2013.01); *G01R 35/005* (2013.01)

(58) Field of Classification Search
CPC ..... G01R 19/00; G01R 35/005; G01R 35/007
USPC ......................................... 324/705, 100, 101
See application file for complete search history.

(56) References Cited

U.S. PATENT DOCUMENTS

| 4,004,190 A | * | 1/1977 | Simpson | ........................ 315/403 |
| 4,499,401 A | * | 2/1985 | Graves et al. | ................. 313/315 |

(Continued)

FOREIGN PATENT DOCUMENTS

| CN | 1880965 A | 7/2000 |
| CN | 101038305 A | 9/2007 |

(Continued)

*Primary Examiner* — Tung X Nguyen
*Assistant Examiner* — Zannatul Ferdous
(74) *Attorney, Agent, or Firm* — Gokalp Bayramoglu

(57) ABSTRACT

Disclosed are an online alternating current detection device and method. The method includes the following steps: firstly fixedly connecting two sampling points to a segment of wire; amplifying the voltage difference of the sampling points to obtain a median value; subsequently rectifying and filtering and amplifying the median to obtain a direct current amplified value; then utilizing the amplified value, the median value, the multiplying power there between and the resistance value of the wire between the two sampling points to calculate an estimated value of an alternating current; comparing the estimated value to a reference value measured by a standard device between the two sampling points; then adjusting the multiplying power of the amplified value relative to the median until the estimated value coincides with the reference value, only then can the alternating current be measured online. The present solution employs a microvolt voltage measurement manner, there is no need to perform sampling processing in auxiliary components besides an online wire, so there is no need to consider the measuring range, power consumption, cost and specification problems of the auxiliary components, and the performance is stable with good consistency. At the same time, the security is good and the measuring range is wide.

5 Claims, 3 Drawing Sheets

(56) References Cited

U.S. PATENT DOCUMENTS

| | | | | |
|---|---|---|---|---|
| 5,812,411 | A | * | 9/1998 | Calabrese et al. ............. 702/64 |
| 8,983,789 | B1 | * | 3/2015 | Voo ............................. 702/104 |
| 2007/0030679 | A1 | * | 2/2007 | Lee ............................. 362/249 |
| 2009/0115620 | A1 | * | 5/2009 | Hunter et al. ................. 340/664 |
| 2011/0074382 | A1 | * | 3/2011 | Patel .......................... 324/76.11 |

FOREIGN PATENT DOCUMENTS

| | | |
|---|---|---|
| CN | 102253270 A | 11/2011 |
| ES | 2026088 A6 | 4/1992 |
| JP | 2000187054 A | 7/2000 |

* cited by examiner

ONLINE ALTERNATING CURRENT DETECTION DEVICE AND METHOD

FIELD OF THE INVENTION

The present invention relates to an alternating current detection device and the method, especially to an online alternating current detection device and the method.

BACKGROUND OF THE INVENTION

Alternating current measurement is an important detection object in electric energy measurement; conventional alternating current measurement methods comprise: high resistance and voltage dividing method with a multi-meter; electro-magnetic converting method with a transformer; electro-magnet-elector measurement method with a turbine watt-hour meter. Mature products according to above methods are applied in meters, industry and household applicability, and widely applied.

However, if long and continuous online measurement is desired, especially in mass and widespread distribution detection, the conventional methods result in an inevitable problem, on one hand, that is energy consumption. An additional auxiliary energy consumption component is needed for sampling so that the alternating current could be detected; no matter in the external voltage dividing resistance of the high resistance and voltage dividing method or in the electro-magnetic converter; it inevitably causes continuous energy consumption; in the other hand, the energy consumption component consumes relative hardware, thus not only adding the cost unavoidably but also consuming resource; for example silicon steel plate, insulation material and copper line material are needed when applying the electro-magnetic converter.

SUMMARY OF THE INVENTION

The object of the present invention is provide an online alternating current detection device and the method to solve the problems of the conventional alternating current detecting methods and devices that the additional detection component causes energy consumption, cost consumption and resource consumption problems. The technical proposal of the present invention is as below:

An online alternating current detection device, comprising an alternating signal sampling circuit; a power frequency alternating amplifying circuit; a detecting circuit; a calibrating circuit and a signal indicator; the alternating signal sampling circuit comprising a micro-normal sampling circuit and disposed with a segment of wire and two sampling points along the wire; the power frequency alternating amplifying circuit comprising two inputs connected to the two sampling points (PP') for amplify the voltages of the inputs and then output from a median port (11); the detecting circuit connected to the median port (11) and disposed with an amplifying output (21) to amplify the voltage of the median port (11) in a second stage and then output after rectifying and filtering; the calibrating circuit disposed between the amplifying output (21) and the ground and disposed with a potentiometer (T1) to adjust the voltage of the amplifying output (21); the amplifying output (21) connected to the signal indicator, the signal indicator capable of converting the voltage of the amplifying output (21) to the alternating value of electric current loop of the micro-normal sampling circuit and then displaying the output.

In another preferred embodiment, the power frequency alternating amplifying circuit comprises:

an operational amplifier (U1), one end of the input thereof is grounded by a resistance (R1) and is connected to the output thereof by a resistance (R2); and to be severed as the median port; further another end of the input thereof is connected to one of the sampling points;

a clamping circuit, comprising a diode (D1); a diode (D2) and a protection resistance (R16) connected in parallel; two ends of the protection resistance (R16) are respective connected to the two sampling points;

the amplifying power of the power frequency alternating amplifying circuit is ≥50.

In another preferred embodiment, the detecting circuit comprises:

an operational amplifier (U2), one end of the input thereof is connected to the median port (11) by a resistance (R4), another end of the input thereof is connected to a capacitance (C1) and a resistance (R5);

a filtering network, in which: the positive pole of a diode (D3) is connected to the negative pole of a diode (D4); and at the same time a capacitance (C2) is connected between another end of the resistance (R5) and the output of the operational amplifier (U2); a resistance (R7) and a capacitance (C3) are connected in parallel and further connected to the negative pole of the diode (D3); a resistance R8 and a capacitance (C4) are connected in parallel and further connected to the positive pole of the diode (D4); another end the resistance (R7), another end of the capacitance (C3), another end of the resistance (R8) and another end of the capacitance (C4) are connected together, then are connected to a resistance (R6), and are grounded by a resistance (R9) at the same time; another end of the resistance (R6) is connected to another end of the capacitance (C1);

thereinto, the negative pole of the diode (D3) is served as the amplifying output (21).

In another preferred embodiment, the calibrating circuit comprises a resistance (R10); a resistance (R11); the potentiometer (T1); a capacitance (C5) and a resistance (R12) series connected in order; another end of the resistance (R10) is connected to the amplifying output (21); another end of the resistance (R12) is grounded; the adjusting end of the potentiometer (T1) is connected to a reference potential end; one end of the capacitance (C5) is connected to a connection point of the resistance (R10) and the resistance (R11), while another end is grounded.

In another preferred embodiment, the wire is a long-shaped metal; and the micro-normal sampling circuit is sleeved on the outside of the wire.

In another preferred embodiment, the signal indicator comprises a digitron driving circuit and a multi-hit digitron display module coupled to the digitron driving circuit.

An online alternating current detection method, comprising steps:

fixedly connecting two sampling points to a segment of wire along the longitudinal direction;

putting the wire and the sampling points into the detected electric current loop; amplifying the voltage difference of the sampling points in first stage to get a median value;

rectifying and filtering the median value, and amplifying in the second stage to get a direct current amplified value;

utilizing the amplified value, the median value, the multiplying power there between and the resistance value of the wire between the two sampling points to calculate an estimated value of an alternating current;

comparing the estimated value to a reference value measured between the two sampling points by a standard device;

then adjusting the amplifying power of the amplified value relative to the median value until the estimated value coincides with the reference value.

In another preferred embodiment, the resistance value is computed from the resistivity of the wire and the geometrical characteristic of the sampling points.

The technical proposal of the present invention has advantages as below:

1. applied with a segment of wire as the sampling element and nano voltmeter measurement method, it wouldn't consume extra power in one hand, in the other hand, no additional auxiliary component except the online wire is needed for sampling, the current measurement range is wide; besides, with the online wire, as the measurement is only limited by the references of the good conductor of the sampling element, the range and specification problems of the auxiliary component are not needed to be considered, thus obtaining a stable and reliable performance, further ensuring the consistence; the present measurement device costs lower.

2. with the online wire, no auxiliary component, such as a mutual conductor or a high value resistance is needed; thus preventing the security risk of the auxiliary component, so the security is good.

3. in the estimating step, the resistance value is computed from the resistivity of the good conductor and the geometrical characteristics between the sampling points; thus making the resistance value, the temperature/humidity characteristic easily to be controlled, and realizing uniformity in mass production.

4. with the dual amplifying, the amplifying of the first stage is applied in the power frequency alternating amplifying circuit; the amplifying of the second stage is applied in the detecting circuit; on one hand, the alternating current of the sampling end is highly amplified, the amplifying path is Short enough to ensure the amplifying precision; in the other hand, the amplifying power of the detecting circuit is controlled by the calibrating circuit and is changeable, so that the stability of the first stage signal will not be influenced when calibrating, therefore obtaining high stability and high precision.

5. the technical proposal applies low resistivity for online detecting the alternating current, so that it is applicable for other detection device and the method thereof; for example a low resistance measuring device, a watt-hour meter, a power meter, an over-current switch, and so on; the alternative application also retains the advantages of low power and high reliability, and the relevant detection methods/devices are under the same principle.

BRIEF DESCRIPTION OF THE DRAWINGS

The present invention will be further described with the drawings and the embodiments.

DETAILED DESCRIPTION OF THE EMBODIMENTS

Figure 1:
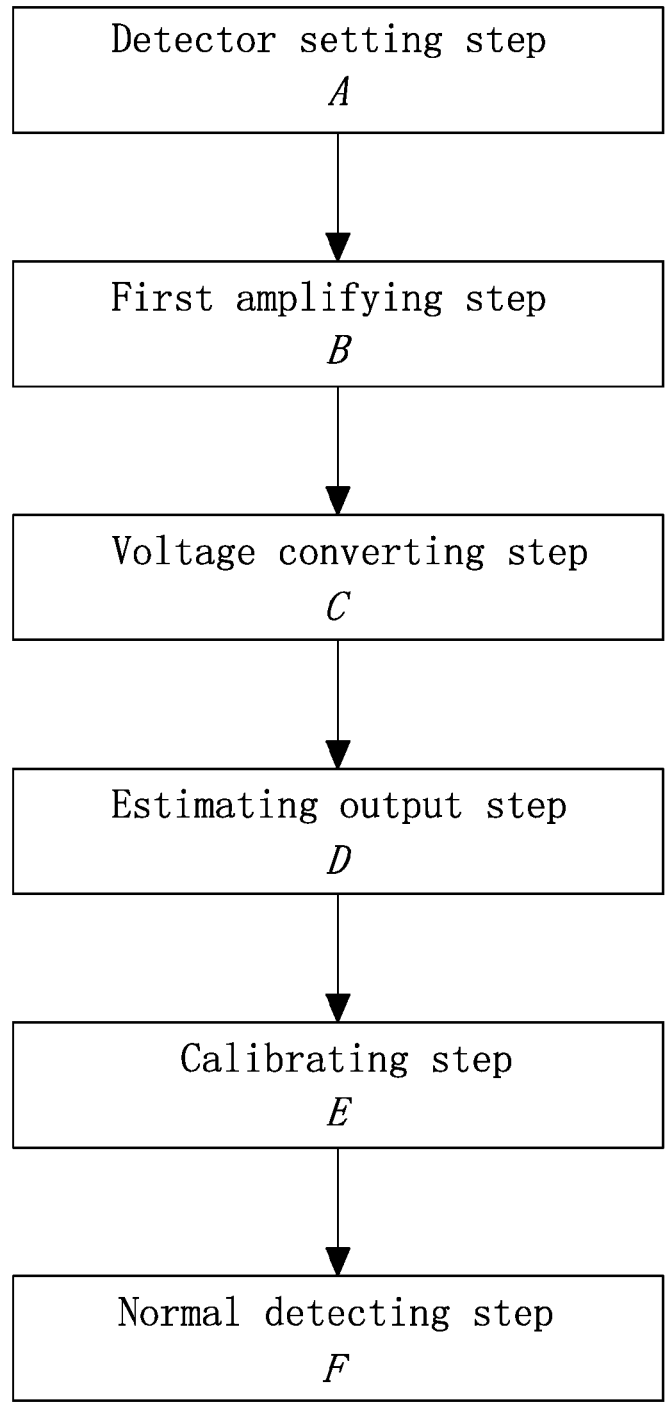
FIG. 1 schematically illustrates a work flow of an online alternating current detection method of the first embodiment of the present invention.
Figure 2:
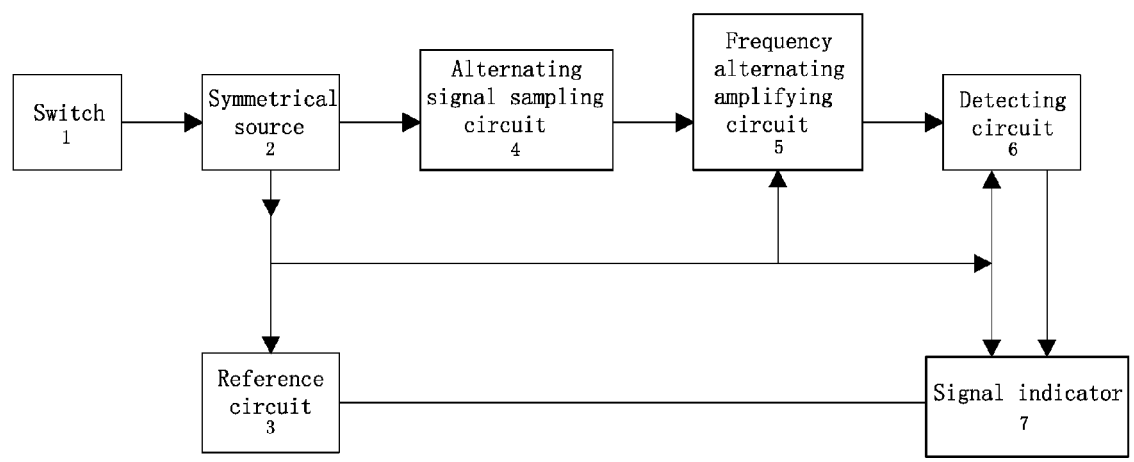
FIG. 2 schematically illustrates a module diagram of an online alternating current detection device corresponding to the online alternating current detection method of the first embodiment.

First Embodiment:

FIG. 1 is a work flow of an online alternating current detection method of the first embodiment of the present invention; FIG. 2 is a module diagram of the corresponding device of the embodiment in FIG. 1; combining FIG. 1 and FIG. 2, this embodiment is further described:

FIG. 1 shows the steps of the online alternating current detection method:

Detector setting step A: in this step, utilizing a segment of wire R3 as the micro-normal sampling circuit; wire R3 is a segment of red copper, the diameter thereof is 2 mm; the effective length intercepted in the sampling ends PP' is 5.5 cm, PP' ends are stably contacted to wire R3;

First amplifying step B: after detector setting step A is done, the wire is in the detected electric current loop; the detected electric current loop flows through PP' ends, as PP' ends have resistance constantly, so that PP' ends have voltage drop; the voltage drop value of the AC voltage is amplified at least 50 times in the first stage to obtain a median value in power frequency alternating amplifying circuit 5.

Voltage converting step C: after above first amplifying step B, the detecting circuit 6 amplifies the median value in the second stage and then rectifiers and filters, so that an at least 10 times amplified value is obtained on the basis the media value; normally, after the median value is amplified to the amplified value, the voltage drop of wire R3 is amplified about 1000 times;

Estimating output step D: as the resistance of above wire R3 between sampling points PP' is determined, and meanwhile the total amplifying power of the median value and the amplified value are uniquely determined by device; so according to the data, g the current value of two resistances R3 along sampling ends PP' is determined according to ohm's law, that is an estimated value; consider the actual cases, for example the ohm contact of sampling ends PP', the error of the amplifier, the change of the composition of the wire, there are differences between the estimated value and the actual value.

Calibrating step E: this step is applied with a reference device (not figured out), such as a clamp ammeter, to synchronously detect the current of wire R3 thus to obtain a reference value; comparing the reference value and the estimated value; adjusting the potentiometer of the calibrating circuit in reference circuit at the same time, so that the amplifying power of detecting circuit 6 is adjusted, the amplifying power is changed to couple to the reference value.

Normal detecting step F: after above calibrating step, the amended amplified value can reflect accurately the actual current of sampling ends PP'.

It is thus clear that the method is applied with an online good conductor as the sampling element, it won't consume extra power in one hand, in the other hand, no additional auxiliary component except the online wire is needed for sampling, the current measurement range is wide; besides, with the online wire, as the measurement is only limited by the references of the good conductor of wire R3 of the sampling element, thus obtaining stable and reliable performance, further ensuring the consistence; the present measurement device costs lower. in the estimating step, the resistance value is computed from the resistivity of the good conductor and the geometrical characteristics between the sampling points PP'; thus making the resistance value, the temperature/humidity characteristic easily to be controlled, and realizing uniformity in mass production; the whole technical proposal is not influenced by the ohmic contact of the wire R3 and the return circuit thereof, the connect and the disconnect are convenient.

Especially, the device is applied with two stages of amplifying method, the first stage of amplifying is in power frequency alternating amplifying circuit 5; the second one is in detecting, circuit 6, the alternating current of the sampling end is highly amplified, the amplifying path is short enough to ensure the amplifying precision; in the other hand, the amplifying power of detecting circuit 6 is controlled by reference circuit 3 and is changeable, so that the stability of the first stage signal will not be influenced when calibrating, therefore it is provided with high stability and high precision.

Figure 3:
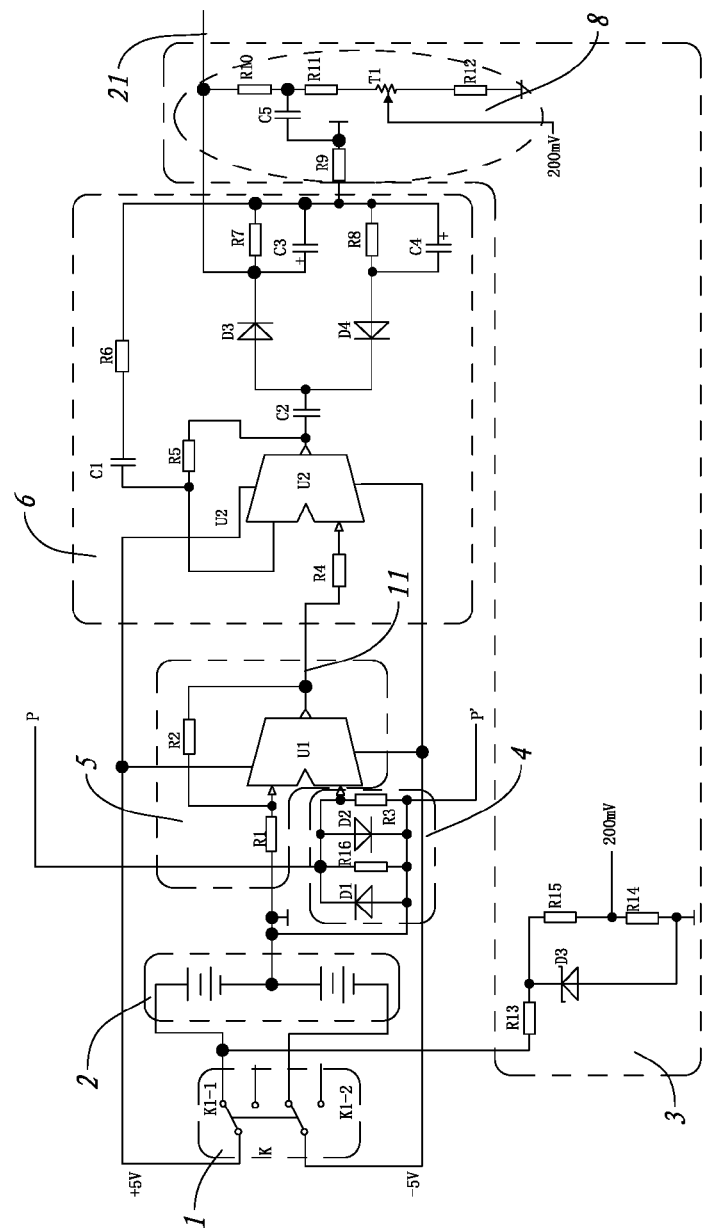
FIG. 3 schematically illustrates a circuit diagram of the online alternating current detection device of the second embodiment of the present invention.

Second Embodiment:

As figured in FIG. 2 and FIG. 3, the online alternating current detection device of the present invention comprising alternating signal sampling circuit 4, power frequency alternating amplifying circuit 5, detecting circuit 6, calibrating circuit 8 and signal indicator 7; alternating signal sampling circuit 4 comprises a micro-normal sampling circuit which is disposed with a segment of wire R3 and two sampling points PP' along the wire; power frequency alternating amplifying circuit 5 comprises two inputs connected to two sampling points PP' for amplifying the voltages of the inputs and then output out from median port 11; detecting circuit 6 is connected to median port 11 and is disposed with amplifying output 21 to amplify the voltage of median port 11 in the second stage and then to output after rectifying and filtering; calibrating circuit 8 is disposed in reference circuit 3 between amplifying output 21 and the ground and is disposed with a potentiometer T1 to adjust the voltage of amplifying output 21; amplifying output 21 is connected to the signal indicator (not figured out); the signal indicator is capable of converting the voltage of amplifying output 21 to the alternating current value of the electric current loop of the micro-normal sampling circuit and then displaying the output.

This embodiment employs symmetrical source 2 which could be an external direct current power system; or it could be the direct current regulated power output of the power end.

The power frequency alternating amplifying circuit comprises operational amplifier U1, one end of the input thereof is grounded by resistance R1 and is connected to the output by resistance R2 to be median port 11; another end of the input thereof is connected to one of the sampling points, P end; thereinto resistance R2 forms a proper feedback from the output of operational amplifier U1 to the input thereof resistance R1 is connected, thus making the voltage of median port 11 50-200 times of the voltage across the two ends of wire R3; in this proper amplifying power scope, median port 11 is capable of obtaining an alternating voltage with stability and enough amplitude; resistance R2 has a resistance of 50 MΩ.

In the input end of operational amplifier U1, a protection network is connected in parallel to wire R3, the protection network comprises diode D1, diode D2 and protection resistance R16 connected in parallel; two ends of protection resistance 16 are respectively connected to two sampling points PP'; obviously, the current flows only through wire R3 of low resistance when in normal work. With the protection circuit, if there is any failure in wire R3, like broken, poor contact or other circuit break problems; the current of PP' series connected to the electric current loop will not directly flow through the input end of first operational amplifier U1, thus avoiding circuit damage.

In the second embodiment, detecting circuit 6 comprises operational amplifier U2 one end of which is connected to median port 11 by resistance R4, while another end is connected to capacitance C1 and resistance R5;

A filtering network is connected in the following stage of operational amplifier U2; in this filtering network, the positive pole of diode D3 is connected to the negative pole of diode D4, meanwhile capacitance C2 is connected between another end of resistance R5 and the output of operational amplifier U2; the negative pole of diode D3 is connected to resistance R7 and capacitance C3, resistance R7 and capacitance C3 are connected in parallel; the positive pole of diode D4 is connected to resistance R8 and capacitance C4, resistance R8 and capacitance C4 are connected in parallel; another ends of resistance R7, capacitance C3, resistance R8 and capacitance C4 are connected together, further connected to resistance R6, resistance R9 is grounded; another end of resistance R6 is connected to another end of capacitance C1; the negative pole of diode D3 is severed as amplified output 21.

Calibrating circuit 8 of this embodiment is disposed in reference circuit 3, and it is disposed with series connected resistance R10, resistance R11, potentiometer T1, capacitance C5 and resistance R12; another end of resistance R10 is connected to amplified output 21; capacitance C5 is for filtering, thus making the output voltage jump smooth; another end of resistance R12 is grounded; the adjusting end of potentiometer T1 is connected to a reference potential end of 200 mV in reference circuit 3.

In this embodiment, operational amplifier U1 and U2 are powered with ±10V supply voltage, so that the alternating current is amplified symmetrically. The setting of two wires R3 is similar to the first embodiment, they are copper with round cross section; PP' is fixed to the wire and is sleeved on the outside of the wire and form the micro-normal sampling circuit. Amplified output end 21 is connected to a signal indicator (not figured out), the signal indicator is applied with existing A/D converting digitron indicator comprising a digitron driving circuit and a multi-bit digitron display module coupled to the digitron driving circuit. With ±5V supply voltage, it consumes less energy and indicates accurately. Reference circuit 3 supplies reference voltage to the signal indicator.

From above embodiment, with the low resistance to online detect alternating current, it is applicable for other detection device and the method thereof; for example a low resistance measuring device, a watt-hour meter, a power meter, an over-current switch, and so on; the alternative application also retains the advantages of low power and high reliability, and the relevant detection methods/devices are under the same principle.

Although the present invention has been described with reference to the preferred embodiments thereof for carrying out the patent for invention, it is apparent to those skilled in the art that a variety of modifications and changes may be made without departing from the scope of the patent for invention which is intended to be defined by the appended claims.

I claim:

1. An online alternating current detection device, comprising: an alternating signal sampling circuit; a power frequency alternating amplifying circuit; a detecting circuit; a calibrating circuit and a signal indicator;

wherein the alternating signal sampling circuit comprises a micro-normal sampling circuit and disposed with a segment of wire and two sampling points along the wire; the power frequency alternating amplifying circuit comprises two inputs connected to the sampling points (PP') for amplifying the voltages of the inputs and then output from a median port(11); the detecting circuit is connected to the median port (11) and disposed with an amplifying output (21) to amplify the voltage of the median port (11) in a second stage and then outputs after rectifying and filtering; the calibrating circuit is disposed between the amplifying output (21) and the ground and disposed with a potentiometer (T1) to adjust the voltage of the amplifying output(21); the amplifying output(21) is connected to the signal indicator; andthe signal indicator is capable of converting the voltage of the amplifying output (21) to the alternating value of electric current loop of the micro-normal sampling circuit and then displays the output;

wherein the detecting circuit comprises: an operational amplifier (U2), one end of the input thereof is connected to the median port (11) by a resistance (R4), another end of the input thereof is connected to a capacitance (C1) and a resistance (R5);

a filtering network, in which: the positive pole of a diode (D3) is connected to the negative pole of a diode (D4); and at the same time a capacitance (C2) is connected between another end of the resistance (R5) and the output of the operational amplifier (U2); a resistance (R7) and a capacitance (C3) are connected in parallel and further connected to the negative pole of the diode (D3); a resistance (R8) and a capacitance (C4) are connected in parallel and further connected to the positive pole of the diode (D4); another end of the resistance (R7), another end of the capacitance (C3), another end of the resistance (R8) and another end of the capacitance (C4) are connected together, then are connected to a resistance (R6), and are grounded by a resistance (R9) at the same time; another end of the resistance (R6) is connected to another end of the capacitance (C1); thereinto, the negative pole of the diode (D3) is served as the amplifying output (21).

2. The online alternating current detection device according to claim 1, wherein the power frequency alternating amplifying circuit comprises:
an operational amplifier (U1), one end of the input thereof is grounded by a resistance (R1) and is connected to the output thereof by a resistance (R2); and to be severed as the median port; further, another end of the input thereof is connected to one of the sampling points;
a clamping circuit, comprising a diode (D1); a diode (D2) and a protection resistance (R16) connected in parallel; two ends of the protection resistance (R16) are respectively connected to the two sampling points; and
the amplifying power of the power frequency alternating amplifying circuit is ≤50.

3. The online alternating current detection device according to claim 1, wherein the calibrating circuit comprises a resistance (R10); a resistance (R11); the potentiometer (T1); a capacitance (C5) and a resistance (R12) series connected in order;
another end of the resistance (R10) is connected to the amplifying output;
another end of the resistance (R12) is grounded;
the adjusting end of the potentiometer (T1) is connected to a reference potential end;
one end of the capacitance (C5) is connected to a connection point of the resistance (R10) and the resistance (R11), while another end is grounded.

4. The online alternating current detection device according to claim 1, wherein the wire is a long-shaped metal; and the micro-normal sampling circuit is sleeved on the outside of the wire.

5. The online alternating current detection device according to claim 1, wherein the signal indicator comprises a digitron driving circuit and a multi-bit digitron display module coupled to the digitron driving circuit.

* * * * *